(12) United States Patent
Li et al.

(10) Patent No.: US 11,703,630 B2
(45) Date of Patent: Jul. 18, 2023

(54) MINI-LED BACKLIGHT PANEL AND MINI-LED BACKLIGHT MODULE

(71) Applicant: TCL CHINA STAR OPTOELECTRONICS TECHNOLOGY CO., LTD., Shenzhen (CN)

(72) Inventors: Dehua Li, Shenzhen (CN); Linlin Fu, Shenzhen (CN); Xin Zhang, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 554 days.

(21) Appl. No.: 16/963,229

(22) PCT Filed: Jun. 16, 2020

(86) PCT No.: PCT/CN2020/096410
§ 371 (c)(1),
(2) Date: Jul. 19, 2020

(87) PCT Pub. No.: WO2021/237824
PCT Pub. Date: Dec. 2, 2021

(65) Prior Publication Data
US 2023/0087424 A1    Mar. 23, 2023

(30) Foreign Application Priority Data

May 26, 2020   (CN) .......................... 202010453842.8

(51) Int. Cl.
*F21V 8/00*    (2006.01)

(52) U.S. Cl.
CPC ......... *G02B 6/0055* (2013.01); *G02B 6/0051* (2013.01); *G02B 6/0073* (2013.01)

(58) Field of Classification Search
CPC ... G02B 6/0055; G02B 6/0051; G02B 6/0073
See application file for complete search history.

(56) References Cited

U.S. PATENT DOCUMENTS

| RE47,656 E | 10/2019 | Bae et al. |
| 2017/0199604 A1 | 7/2017 | Lin et al. |

(Continued)

FOREIGN PATENT DOCUMENTS

| CN | 101749601 A | 6/2010 |
| CN | 102576520 A | 7/2012 |

(Continued)

*Primary Examiner* — Mary Ellen Bowman
(74) *Attorney, Agent, or Firm* — PV IP PC; Wei Te Chung; Zhigang Ma

(57) ABSTRACT

A mini-LED backlight structure and a backlight module are provided. The mini-LED backlight structure includes a backplate, a glass substrate, and reflective sheets. The glass substrate includes a line surface and a lineless surface close to a side of the backplate. Light emitting diodes and a connector are disposed on the lineless surface. Furthermore, a gap is between the backplate and the glass substrate for disposing the light emitting diodes and the connector. The connector is electrically connected to an external circuit through a conducting wire. Disposing a plurality of elements, the connector, and the light emitting diodes on a same surface of the lineless surface is unlikely affecting backlight effect and saves materials at a same time.

20 Claims, 4 Drawing Sheets

(56) References Cited

U.S. PATENT DOCUMENTS

2019/0025647 A1\* 1/2019 Cheng ............... G02F 1/133606
2020/0320939 A1 10/2020 Ma et al.

FOREIGN PATENT DOCUMENTS

| | | | |
|---|---|---|---|
| CN | 202327896 U | 7/2012 | |
| CN | 202452301 U | 9/2012 | |
| CN | 105676537 A | 6/2016 | |
| CN | 206321919 U | 7/2017 | |
| CN | 107390428 A | 11/2017 | |
| CN | 108681118 A | 10/2018 | |
| CN | 109270738 A \* | 1/2019 | ........... G02B 6/0036 |
| CN | 109324442 A | 2/2019 | |
| CN | 109461376 A | 3/2019 | |
| CN | 109496068 A | 3/2019 | |
| CN | 109633978 A | 4/2019 | |
| CN | 110346972 A | 10/2019 | |
| CN | 209624946 U | 11/2019 | |
| CN | 110850635 A | 2/2020 | |
| JP | 2001272691 A | 10/2001 | |
| WO | 2020065472 A1 | 4/2020 | |
| WO | 2020100449 A1 | 5/2020 | |

\* cited by examiner

MINI-LED BACKLIGHT PANEL AND MINI-LED BACKLIGHT MODULE

FIELD OF INVENTION

The present disclosure relates to the field of backlight technology, and particularly relates to a mini light emitting diode (mini-LED) backlight structure and a mini-LED backlight module.

BACKGROUND OF INVENTION

In current mini light emitting diode (mini-LED) backlight structures, because light emitting diodes or a plurality of elements can only be disposed on a line surface of a glass substrate, the plurality of elements absorb light on a backlight, shadows are generated on the backlight due to large areas of the elements, and components with large areas, such as connectors, are unable to be disposed, only chips on films can be used to connect external circuits. Therefore, a technical problem of unable disposing the connector and the plurality of elements on the surface of the glass substrate exists in the current mini-LED backlight structures.

SUMMARY OF INVENTION

Embodiments of the present disclosure provide a mini light emitting diode (LED) backlight structure and a mini-LED backlight module which can ease the technical problem of unable disposing the connector and the plurality of elements exists on the surface of the glass substrate in the current mini-LED backlight structures.

The present disclosure provides a mini-LED backlight structure, including:

a backplate;

a glass substrate disposed on the backplate and comprising a line surface and a lineless surface, wherein the lineless surface is close to a side of the backplate, and a plurality of light emitting diodes and a connector are disposed on a surface of the lineless surface, and a plurality of reflective sheets disposed on the line surface, wherein a gap between the backplate and the glass substrate is for disposing the light emitting diodes and the connector, the connector is electrically connected to an external circuit through a conducting wire, and light emitting surfaces of the light emitting diodes face toward the plurality of reflective sheets.

In the mini-LED backlight structure provided by an embodiment of the present disclosure, a plurality of elements are further disposed on the lineless surface, and the plurality of elements are arranged around the light emitting diodes.

In the mini-LED backlight structure provided by an embodiment of the present disclosure, the plurality of reflective sheets are not disposed on the light emitting diodes, and the plurality of reflective sheets are disposed on the plurality of elements and the connector.

In the mini-LED backlight structure provided by an embodiment of the present disclosure, a via hole is defined on the backplate, and the connector is electrically connected to an external circuit through the via hole.

In the mini-LED backlight structure provided by an embodiment of the present disclosure, the connector is directly and electrically connected to an external circuit through a region outside the backplate.

In the mini-LED backlight structure provided by an embodiment of the present disclosure, the light emitting diodes are arranged into an array on the lineless surface to form an LED array.

In the mini-LED backlight structure provided by an embodiment of the present disclosure, the plurality of elements are disposed on the lineless surface, and the plurality of elements are disposed symmetrically on two sides of the light emitting diodes.

In the mini-LED backlight structure provided by an embodiment of the present disclosure, the plurality of reflective sheets are disposed on two sides of the light emitting diodes and are disposed into an array.

The present disclosure provides a mini-LED backlight module, including a mini-LED backlight structure, and a diffusion plate, a optical diaphragm, and a screen which are sequentially disposed above the mini-LED backlight structure, wherein the mini-LED backlight structure includes:

a backplate;

a glass substrate disposed on the backplate and comprising a line surface and a lineless surface, wherein the lineless surface is close to a side of the backplate, and light emitting diodes and a connector are disposed on a surface of the lineless surface, and a plurality of reflective sheets disposed on the line surface, wherein a gap between the backplate and the glass substrate is for disposing the light emitting diodes and the connector, the connector is electrically connected to an external circuit through a conducting wire, and light emitting surfaces of the light emitting diodes face toward the plurality of reflective sheets.

In the mini-LED backlight module provided by an embodiment of the present disclosure, a plurality of elements are disposed on the lineless surface, and the plurality of elements are arranged around the light emitting diodes, a light guide plate is disposed above the light emitting diodes, and the plurality of reflective sheets are disposed on two sides of the light guide plate.

In the mini-LED backlight module provided by an embodiment of the present disclosure, a via hole is defined on the backplate, the connector is electrically connected to an external circuit through the via hole, and a sectional shape of the via hole is a trapezoidal shape or a rectangle.

In the mini-LED backlight module provided by an embodiment of the present disclosure, gaps between adjacent light emitting diodes are equal.

In the mini-LED backlight module provided by an embodiment of the present disclosure, the optical diaphragm includes a first optical diaphragm and a second optical diaphragm.

In the mini-LED backlight module provided by an embodiment of the present disclosure, the first optical diaphragm is located above the mini-LED backlight structure, and the second optical diaphragm is disposed above the first optical diaphragm.

In the mini-LED backlight module provided by an embodiment of the present disclosure, the first optical diaphragm includes a first surface close to the light emitting diodes, and the first surface includes a plurality of first light diffusing structures.

In the mini-LED backlight module provided by an embodiment of the present disclosure, the first optical diaphragm includes a second surface away from the light emitting diodes, and the second surface includes a plurality of first supporting reflective structures.

In the mini-LED backlight module provided by an embodiment of the present disclosure, a plurality of elements are disposed on the lineless surface, and the plurality of elements are disposed symmetrically on two sides of the light emitting diodes.

In the mini-LED backlight module provided by an embodiment of the present disclosure, the plurality of reflective sheets are disposed on two sides of the light emitting diodes and are disposed into an array.

In the mini-LED backlight module provided by an embodiment of the present disclosure, the light emitting diodes are disposed on the lineless surface, and a light adjusting unit is disposed above the LED array.

In the mini-LED backlight module provided by an embodiment of the present disclosure, the light adjusting unit is disposed on a light exiting surface of the light guide plate.

Beneficial effects: embodiments of the present disclosure provides the mini-LED backlight structure including the backplate, the glass substrate, and the reflective sheets. The glass substrate is disposed on the backplate. The glass substrate includes the line surface and the lineless surface close to the side of the backplate. The light emitting diodes and a connector are disposed on the lineless surface. Furthermore, a gap between the backplate and the glass substrate is for disposing the light emitting diodes and the connector. The connector is electrically connected to the external circuit through the conducting wire. The light emitting surfaces of the light emitting diodes face toward the plurality of reflective sheets. By disposing the light emitting diodes on the lineless surface, the plurality of elements and the connector are able to be disposed on the lineless surface, backlight effect is not affected, and materials are saved. This eases an existing technical problem being unable to dispose the connector and the elements on the surface of the glass substrate in the current mini-LED backlight structures.

DESCRIPTION OF DRAWINGS

The technical solutions and other advantageous effects of the present invention will be apparent with reference to the following accompanying drawings and detailed description of embodiments of the present disclosure.

DETAILED DESCRIPTION OF PREFERRED EMBODIMENTS

The technical solutions in the embodiments of the present disclosure are clearly and completely described in the following with reference to the accompanying drawings in the embodiments of the present disclosure. Obviously, the described embodiments are only part of the embodiments of the present disclosure, but are not all embodiments of the present disclosure. All other embodiments obtained by those skilled in the art based on the embodiments of the present disclosure without creative efforts are within the scope of the present disclosure.

In the description of the present disclosure, it is to be understood that the orientation or positional relationship indicated by the terms "center", "longitudinal", "transverse", "length", "width", "thickness", "upper", "lower", "front", "rear", "left", "right", "vertical", "horizontal", "top", "bottom", "inside", "outside", "clockwise", "counterclockwise" etc. is based on the orientation or positional relationship shown in the accompanying figures, which is merely for the convenience for describing of the present disclosure and for the simplification of the description, and is not intended to indicate or imply that the indicated devices or elements have a specific orientation or is constructed and operated in a specific orientation. Therefore, it should not be understood as a limitation on the present disclosure. Moreover, the terms "first" and "second" are used for descriptive purposes only and are not to be understood as indicating or implying relative importance or implicitly indicating the number of the indicated technical characteristics. Therefore, the characteristics defined by "first" or "second" may include one or more of the described characteristics either explicitly or implicitly. In the description of the present disclosure, the meaning of "a plurality" is two or more unless clearly and specifically defined otherwise.

Figure 1:
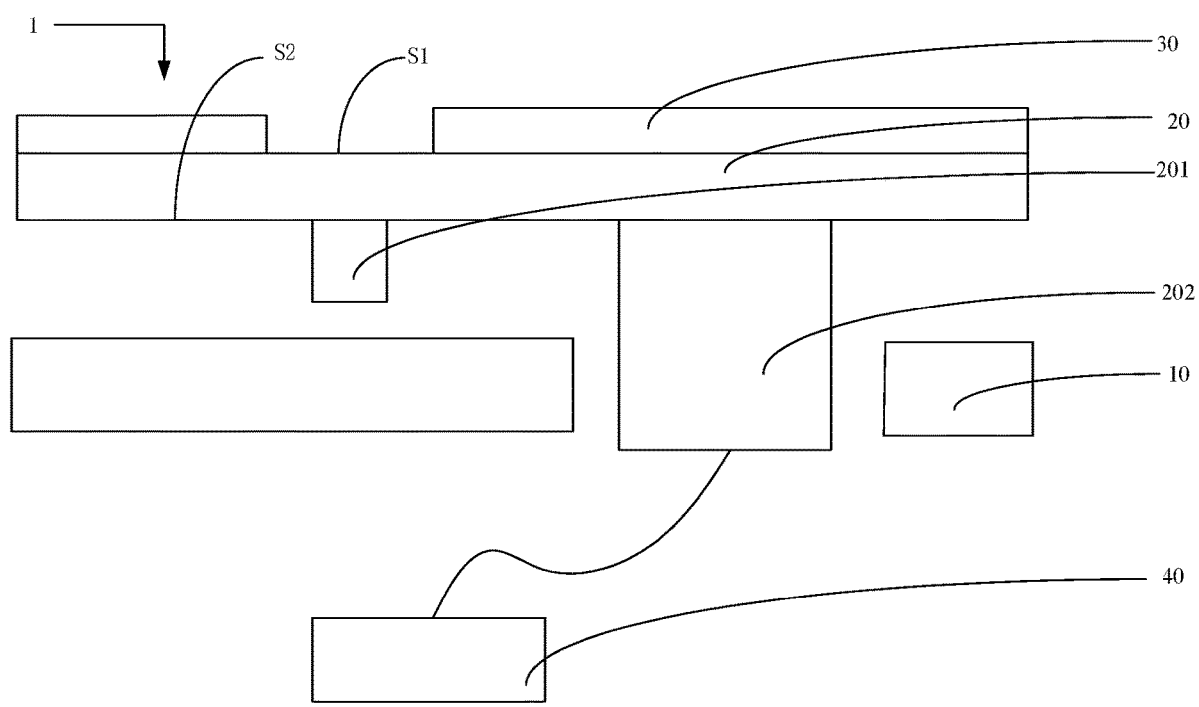
FIG. 1 is a first sectional schematic diagram of a mini light emitting diode (mini-LED) backlight structure provided by an embodiment of the present disclosure.

As illustrated in FIG. 1, a mini light emitting diode (mini-LED) backlight structure 1 provided by an embodiment of the present disclosure includes a backplate 10, a glass substrate 20 disposed on the backplate 10, and reflective sheets 30. The glass substrate 20 includes a line surface S1 and a lineless surface S2. The lineless surface S2 is close to a side of the backplate 10. Light emitting diodes 201 and a connector 202 are disposed on a surface of the lineless surface S2. The reflective sheets 30 are disposed on the line surface S1. Furthermore, a gap between the backplate 10 and the glass substrate 20 is for disposing the light emitting diodes 201 and the connector 202. The connector 202 is electrically connected to an external circuit 40 through a conducting wire. Light emitting surfaces of the light emitting diodes 201 face toward the reflective sheets 30.

In this embodiment, the mini-LED backlight structure 1 includes the backplate 10, the glass substrate 20 disposed on the backplate 10, and the reflective sheets 30. The glass substrate includes the line surface S1 and the lineless surface S2 close to the side of the backplate 10. The light emitting diodes 201 and the connector 202 are disposed on the lineless surface S2. The reflective sheets 30 are disposed on the line surface S1. Furthermore, the gap between the backplate 10 and the glass substrate 20 is for disposing the light emitting diodes 201 and the connector 202. The connector 202 is electrically connected to the external circuit 40 through the conducting wire. The light emitting surfaces of the light emitting diodes 201 face toward the reflective sheets 30. By disposing the light emitting diodes 201 on the lineless surface S2, the elements and the connector 202 are able to be disposed on the lineless surface S2, so backlight effect is not affected, and materials are saved. This eases an existing technical problem of being unable to dispose the connector 202 and the elements 203 on the surface of the glass substrate 20 in the current mini-LED backlight structures.

Furthermore, the plurality of elements include transparent electrodes.

Furthermore, the light emitting diodes are backlight sources in the backlight structure. The plurality of light emitting diodes are disposed on the lineless surface of the glass substrate.

Figure 2:
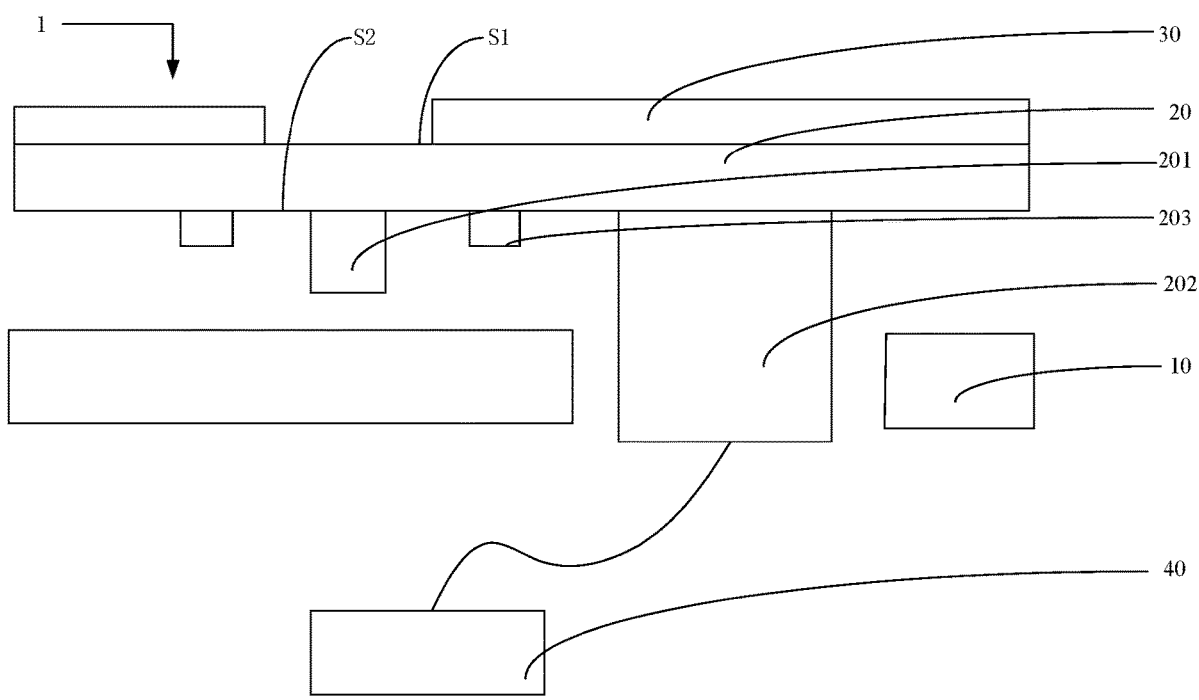
FIG. 2 is a second sectional schematic diagram of the mini-LED backlight structure provided by an embodiment of the present disclosure.

In an embodiment, as illustrated in FIG. 2, a plurality of elements 203 are further disposed on the lineless surface S2, and the plurality of elements 203 are arranged around the light emitting diodes 201.

Furthermore, the plurality of elements 203 include transparent materials. The plurality of elements 203 cannot absorb light from the backlight, and shadows are not generated on the backlight.

Furthermore, in peripheral regions of the light emitting diodes 201, a preparation material of the plurality of elements 203 can be a transparent material. In regions away from the light emitting diodes 201, a preparation material of the plurality of elements 203 can be opaque.

In an embodiment, the reflective sheets 30 are not disposed on the light emitting diodes 201, and the reflective sheets 30 are disposed on the plurality of elements 203 and the connector 30.

Furthermore, the reflective sheets 30 are used to reflect back light surrounding the light emitting diodes 201 to increase a utilization rate of the light.

Furthermore, thicknesses of the reflective sheets 30 sequentially decrease from the peripheral regions of the light emitting diodes 201 to the regions away from the light emitting diodes 201.

In an embodiment, a via hole is defined on the backplate 10, and the connector 202 is electrically connected to an external circuit 40 through the via hole.

Furthermore, sectional shapes of the via hole is any one of a rectangular, trapezoidal, or rhomboid shape.

Furthermore, the via hole can be disposed directly below the connector 202.

Furthermore, the connector 202 can be disposed between adjacent light emitting diodes 201.

In an embodiment, the connector 202 is directly and electrically connected to the external circuit 40 through a region outside the backplate 10.

Furthermore, the connector 202 can also be connected to the external circuit 40 from a lateral region of the backplate 10 by a conducting wire.

Furthermore, the connector 202 can also be connected to the external circuit 40 from other connection region outside the backplate 10. The other connection region includes the gap between the backplate 10 and the glass substrate 20.

In an embodiment, the light emitting diodes 201 are arranged into an array on the lineless surface S2 to form an LED array.

Furthermore, gaps between the adjacent light emitting diodes 201 are equal.

In the current mini-LED backlight structures, because there is only a single-layer circuit on a glass substrate, the light emitting diodes 201 or the plurality of elements can only be disposed on the line surface S1. Moreover, the plurality of elements 203 absorb light from the backlight, and an excessive light absorbing area can generate shadows on the backlight. Therefore, components with a large area such as connectors are unable to be disposed, so only chips on films and printed circuit boards can be used to connect external circuits, which have high costs and are not conducive to assembly. If other elements are disposed on the line surface S1, because the element itself does not emit light, black blocks can be formed on images instead of a pure white image.

In the mini-LED backlight structure 1 and the mini-LED backlight module 2 provided by the present disclosure, by disposing the light emitting diodes 201 on the lineless surface S2, the plurality of elements 203 and the connector 202 can be disposed on the lineless surface S2 at same time.

Therefore, the mini-LED backlight structure 1 and the mini-LED backlight module 2 are not reliant on chips on films and printed circuit boards for connecting to the external circuits 40, and supplies such as chips on films and printed circuit boards are saved.

Figure 3:
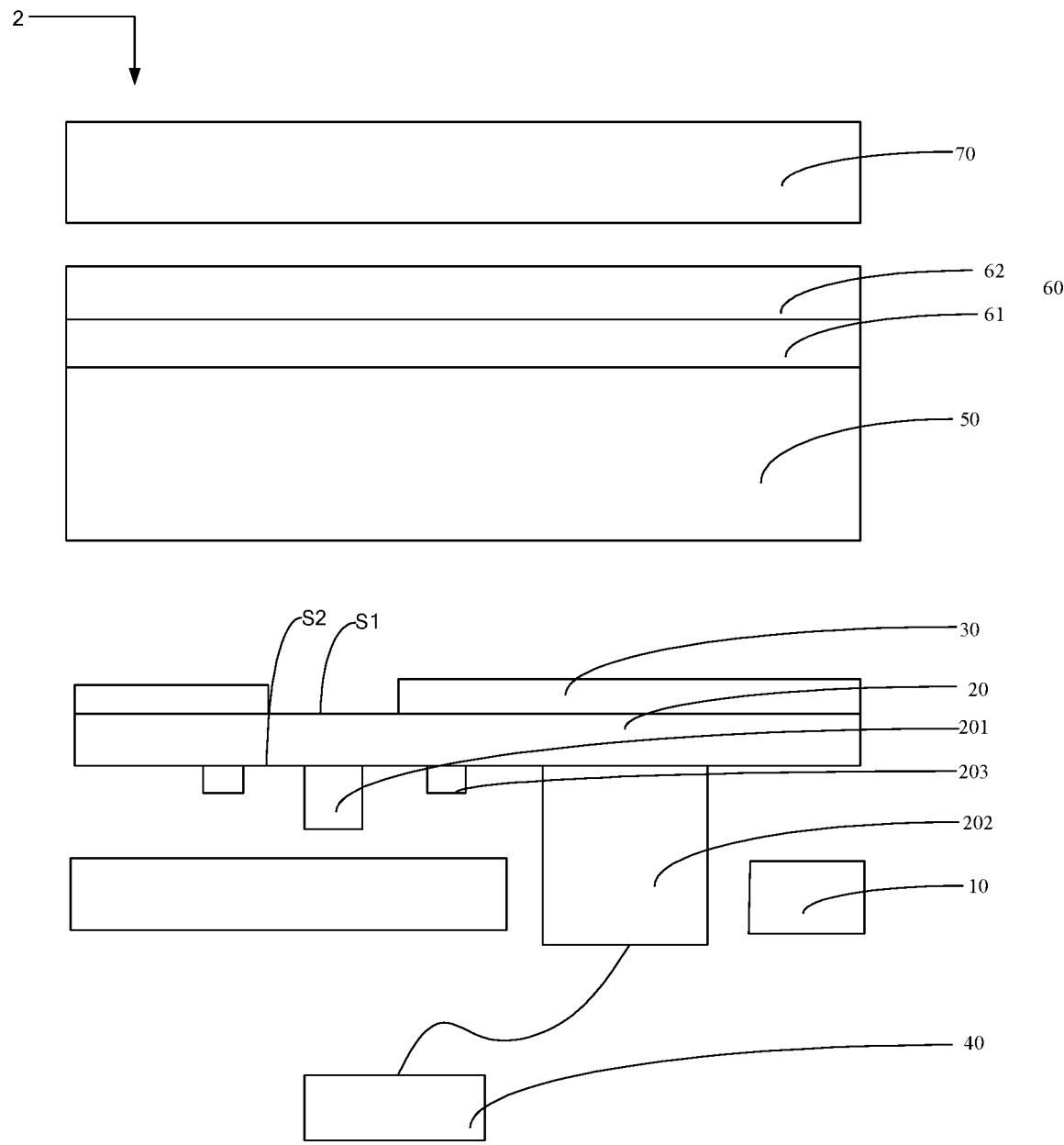
FIG. 3 is a first sectional schematic diagram of a mini-LED backlight module provided by an embodiment of the present disclosure.

As illustrated in FIG. 3, the mini-LED backlight module 2 provided by an embodiment of the present disclosure includes a mini-LED backlight structure, and a diffusion plate 50, an optical diaphragm 60, and a screen 70 which are sequentially disposed above the mini-LED backlight structure. The mini-LED backlight structure includes a backplate 10, a glass substrate 20 disposed on the backplate 10, and reflective sheets 30. The glass substrate 20 includes a line surface S1 and a lineless surface S2. The lineless surface S2 is close to a side of the backplate 10. Light emitting diodes 201 and a connector 202 are disposed on a surface of the lineless surface S2. The reflective sheets 30 are disposed on the line surface S1. Furthermore, a gap between the backplate 10 and the glass substrate 20 is for disposing the light emitting diodes 201 and the connector 202. The connector 202 is electrically connected to an external circuit 40 through a conducting wire. The light emitting surfaces of the light emitting diodes 201 face toward the reflective sheets 30.

In this embodiment, the mini-LED backlight module 2 includes the mini-LED backlight structure, and the diffusion plate 50, the optical diaphragm 60, and the screen 70 which are sequentially disposed above the mini-LED backlight structure. The mini-LED backlight structure includes the backplate 10, the glass substrate 20 disposed on the backplate 10, and the reflective sheets 30. The glass substrate 20 includes the line surface S1 and the lineless surface S2. The lineless surface S2 is close to the side of the backplate 10. The light emitting diodes 201 and the connector 202 are disposed on a surface of the lineless surface S2. The reflective sheets 30 are disposed on the line surface S1. Furthermore, the gap between the backplate 10 and the glass substrate 20 is for disposing the light emitting diodes 201 and the connector 202. The connector 202 is electrically connected to the external circuit 40 through the conducting wire. The light emitting surfaces of the light emitting diodes 201 face toward the reflective sheets 30. By disposing the light emitting diodes 201 on the lineless surface S2, the plurality of elements 203 and the connector 202 are able to be disposed on the lineless surface S2, backlight effect is not affected, and materials are saved. This eases the existing technical problem of being unable to dispose the connector 202 and the elements 203 on the surface of the glass substrate 20 in the current mini-LED backlight structures.

In an embodiment, a plurality of elements 203 are disposed on the lineless surface S2, and the plurality of elements 203 are arranged around the light emitting diodes 201. A light guide plate 204 is disposed above the light emitting diodes 201. The reflective sheets 30 are disposed on two sides of the light guide plate 204.

In an embodiment, the via hole is defined on the backplate 10, and the connector 202 is electrically connected to an external circuit 40 through the via hole. A sectional shape of the via hole is trapezoidal or rectangular.

In an embodiment, the light emitting diodes 201 are arranged into an array on the lineless surface S2 to form an LED array, and gaps between adjacent the light emitting diodes 201 are equal.

In an embodiment, in the mini-LED backlight module 2, a plurality of elements 203 are further disposed on the lineless surface S2, and the plurality of elements 203 are arranged around the light emitting diodes 201.

Furthermore, the plurality of elements 203 include transparent materials. The plurality of elements 203 cannot absorb light in the backlight, and shadow is not generated in a position of the backlight.

Furthermore, in peripheral regions of the light emitting diodes 201, a preparation material of the plurality of elements 203 can be a transparent material. In regions away from the light emitting diodes 201, a preparation material of the plurality of elements 203 can be opaque.

In an embodiment, in the mini-LED backlight module 2, the reflective sheets 30 are not disposed on the light emitting diodes 201, and the reflective sheets 30 are disposed on the plurality of elements 203 and the connector 30.

Furthermore, the reflective sheets 30 are used to reflect back light surrounding the light emitting diodes 201 to increase a utilization rate of the light.

Furthermore, thicknesses of the reflective sheets 30 sequentially decrease from the peripheral regions of the light emitting diodes 201 to the regions away from the light emitting diodes 201.

In an embodiment, in the mini-LED backlight module 2, a via hole is defined on the backplate 10, and the connector 202 is electrically connected to an external circuit 40 through the via hole.

Furthermore, sectional shapes of the via hole is any one of a rectangular, trapezoidal, or rhomboid shape.

Furthermore, the via hole can be disposed directly below the connector 202.

Furthermore, the connector 202 can be disposed between adjacent light emitting diodes 201.

In an embodiment, in the mini-LED backlight module 2, the connector 202 is directly and electrically connected to the external circuit 40 through a region outside the backplate 10 by a conducting wire.

Furthermore, the connector 202 can also be connected to the external circuit 40 from a lateral region of the backplate 10 by a conducting wire.

Furthermore, the connector 202 can also be connected to the external circuit 40 from other connection region outside the backplate 10. The other connection region includes the gap between the backplate 10 and the glass substrate 20.

In an embodiment, in a reversely-disposed mini-LED backlight module 2, the light emitting diodes 201 are arranged into an array on the lineless surface S2 to form an LED array.

Furthermore, gaps between the adjacent light emitting diodes 201 are equal.

In an embodiment, the light guide plate 204 is disposed on the line surface S1. The reflective sheets 30 and the diffusion films are disposed on two sides of the light guide plate 204. The light guide plate 204 is disposed directly above the light emitting diodes 201.

Furthermore, the light enhancement film is disposed on the diffusion films.

Furthermore, a diffusion film is attached on an external surface of the light enhancement film.

In an embodiment, the optical diaphragm includes a first optical diaphragm 61 and a second optical diaphragm 62. the first optical diaphragm 61 is located above the mini-LED backlight structure, and the second optical diaphragm 62 is disposed above the first optical diaphragm 61.

Furthermore, the first optical diaphragm 61 includes a first surface close to the light emitting diodes and a second surface away from the light emitting diodes. The first surface includes a plurality of first light diffusing structures. The second surface includes a plurality of first supporting reflective structures.

In an embodiment, by disposing the light emitting diodes 201 on the lineless surface S2, the plurality of elements 203 and the connector 202 are able to be disposed on the lineless surface S2, backlight effect is not affected, and materials are saved. This eases the existing technical problem of being unable to dispose the connector 202 and the elements 203 on the surface of the glass substrate 20 in the current mini-LED backlight structures.

In an embodiment, the connector 202 and the external circuit 40 can be guided to connect each other by defining a hole on the backplate 10, or they can be guided to connect to each other on other places on the backplate 10 by using a conducting wire.

In an embodiment, a function of the connector 202 is to guide signals or power from other circuit board to the glass substrate 20.

In an embodiment, a certain gap is kept between the backplate 10 and the glass substrate 20 to accommodate the light emitting diodes 201 and other components.

Furthermore, part of the connector 202 can be disposed in the via hole. The gap between the backplate 10 and the glass substrate 20 is greater than heights of the light emitting diodes 201.

Furthermore, the gap between the backplate 10 and the glass substrate 20 is greater than heights of the plurality of elements 203.

Figure 4:
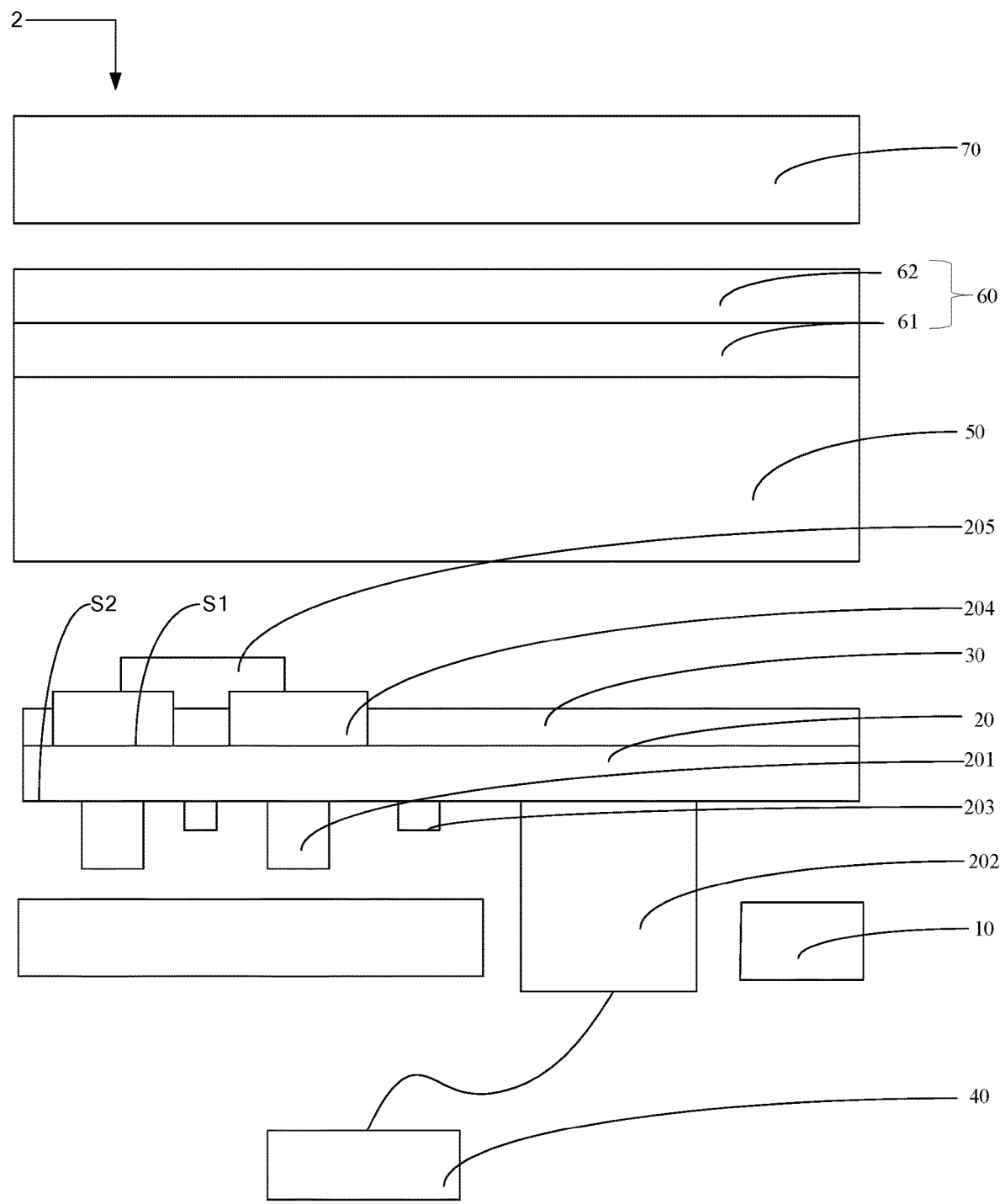
FIG. 4 is a second sectional schematic diagram of the mini-LED backlight module provided by an embodiment of the present disclosure.

In an embodiment, as illustrated in FIG. 4, the light emitting diodes 201 are disposed on the lineless surface S2. A light adjusting unit 205 can be disposed above the light emitting diodes 201 to ease uneven luminescence effect to reduce brightness difference between the second regions and the first regions.

Furthermore, the light adjusting unit 205 can be disposed on an light exiting surface of the light guide plate 204, and an orthogonal projection of the light adjusting unit 205 covers an edge region of the light guide plate 204 close to the light emitting diodes 201.

Furthermore, the first regions are regions between adjacent light emitting diodes 201, and the second regions are regions where the light emitting diodes 201 directly face to.

Furthermore, the light adjusting unit 205 can be also disposed on the line surface S1 of the glass substrate 20. The orthogonal projection of the light adjusting unit 205 on the glass substrate 20 covers orthogonal projections of the light emitting diodes 201 on the glass substrate 20.

The mini-LED backlight structure provided by the embodiments of the present disclosure includes the backplate, the glass substrate disposed above the backplate, and the reflective sheets. The glass substrate includes the line surface and the lineless surface close to the side of the backplate. The light emitting diodes and the connector are disposed on the lineless surface. The reflective sheets are disposed on the line surface. Furthermore, the gap between the backplate and the glass substrate is for disposing the light emitting diodes and the connector. The connector is electrically connected to the external circuit through the conducting wire. The light emitting surfaces of the light emitting diodes face toward the reflective sheets. By disposing the light emitting diodes on the lineless surface, the plurality of elements and the connector are able to be disposed on the lineless surface, backlight effect is not affected, and materials are saved. This eases the existing technical problem of being unable to dispose the connector and the plurality of elements on the surface of the glass substrate in the current mini-LED backlight structures.

The embodiments of present disclosure are described in detail above. This article uses specific cases for describing the principles and the embodiments of the present disclosure, and the description of the embodiments mentioned above is only for helping to understand the method and the core idea of the present disclosure. It should be understood by those skilled in the art, that it can perform changes in the technical solution of the embodiments mentioned above, or can perform equivalent replacements in part of technical characteristics, and the changes or replacements do not make the essence of the corresponding technical solution depart from the scope of the technical solution of each embodiment of the present disclosure.

What is claimed is:

1. A mini light emitting diode (mini-LED) backlight structure, comprising:
   a backplate;
   a glass substrate disposed on the backplate and comprising a line surface and a lineless surface, wherein the lineless surface is close to a side of the backplate, and light emitting diodes and a connector are disposed on a surface of the lineless surface, and
   a plurality of reflective sheets disposed on the line surface, wherein a gap between the backplate and the glass substrate is for disposing the light emitting diodes and the connector, the connector is electrically connected to an external circuit through a conducting wire, and light emitting surfaces of the light emitting diodes face toward the reflective sheet.

2. The mini-LED backlight structure as claimed in claim 1, wherein a plurality of elements are disposed on the lineless surface, and the plurality of elements are arranged around the light emitting diodes.

3. The mini-LED backlight structure as claimed in claim 2, wherein the reflective sheets are not disposed on the light emitting diodes, and the reflective sheets are disposed on the plurality of elements and the connector.

4. The mini-LED backlight structure as claimed in claim 3, wherein a via hole is defined on the backplate, and the connector is electrically connected to an external circuit through the via hole.

5. The mini-LED backlight structure as claimed in claim 3, wherein the connector is directly and electrically connected to an external circuit through a region outside the backplate.

6. The mini-LED backlight structure as claimed in claim 1, wherein the light emitting diodes are arranged into an array on the lineless surface to form an LED array.

7. The mini-LED backlight structure as claimed in claim 1, wherein a plurality of elements are disposed on the lineless surface, and the plurality of elements are disposed symmetrically on two sides of the light emitting diodes.

8. The mini-LED backlight structure as claimed in claim 1, wherein the plurality of reflective sheets are disposed on two sides of the light emitting diodes and are disposed into an array.

9. A mini light emitting diode (LED) backlight module, comprising a mini-LED backlight structure, and a diffusion plate, an optical diaphragm, and a screen which are sequentially disposed above the mini-LED backlight structure, wherein the mini-LED backlight structure comprises:
   a backplate;
   a glass substrate disposed on the backplate and comprising a line surface and a lineless surface, wherein the lineless surface is close to a side of the backplate, and a light emitting diodes and a connector are disposed on a surface of the lineless surface, and
   a plurality of reflective sheets disposed on the line surface, wherein a gap is between the backplate and the glass substrate for disposing the light emitting diodes and the connector, the connector is electrically connected to an external circuit through a conducting wire, and light emitting surfaces of the light emitting diodes face toward the plurality of reflective sheets.

10. The mini-LED backlight module as claimed in claim 9, wherein a plurality of elements are disposed on the lineless surface, and the plurality of elements are arranged around the light emitting diodes, a light guide plate is disposed above the light emitting diodes, and the plurality of reflective sheets are disposed on two sides of the light guide plate.

11. The mini-LED backlight module as claimed in claim 10, wherein a via hole is defined on the backplate, the connector is electrically connected to an external circuit through the via hole, and a sectional shape of the via hole is trapezoidal or rectangular shape.

12. The mini-LED backlight module as claimed in claim 9, wherein gaps between adjacent light emitting diodes are equal.

13. The mini-LED backlight module as claimed in claim 9, wherein the optical diaphragm comprises a first optical diaphragm and a second optical diaphragm.

14. The mini-LED backlight structure as claimed in claim 13, wherein the first optical diaphragm is located above the mini-LED backlight structure, and the second optical diaphragm is disposed above the first optical diaphragm.

15. The mini-LED backlight module as claimed in claim 14, wherein the first optical diaphragm comprises a first surface close to the light emitting diodes, and the first surface comprises a plurality of first light diffusing structures.

16. The mini-LED backlight module as claimed in claim 15, wherein the first optical diaphragm comprises a second surface away from the light emitting diodes, and the second surface comprises a plurality of first supporting reflective structures.

17. The mini-LED backlight module as claimed in claim 9, wherein a plurality of elements are disposed on the lineless surface, and the plurality of elements are disposed symmetrically on two sides of the light emitting diodes.

18. The mini-LED backlight module as claimed in claim 9, the plurality of reflective sheets are disposed on two sides of the light emitting diodes and are disposed in an array manner.

19. The mini-LED backlight module as claimed in claim 9, wherein the light emitting diodes are disposed on the lineless surface, and a light adjusting unit is disposed above the LED array.

20. The mini-LED backlight module as claimed in claim 19, wherein the light adjusting unit is disposed on a light exiting surface of the light guide plate.

* * * * *